(12) United States Patent
Wang et al.

(10) Patent No.: US 11,569,715 B2
(45) Date of Patent: Jan. 31, 2023

(54) INTEGRATED DUAL-MOTOR CONTROLLER

(71) Applicant: HEFEI JEE POWER SYSTEMS Co., Ltd., Anhui (CN)

(72) Inventors: Shuwang Wang, Anhui (CN); Feng Liu, Anhui (CN); Jianhua Mao, Anhui (CN); Yong Cheng, Anhui (CN); Chunzhe Sun, Anhui (CN); Jialun Fan, Anhui (CN); Hongyu Zhang, Anhui (CN)

(73) Assignee: Hefei Jee Power Systems, Co., Ltd., Anhui (CN)

( * ) Notice: Subject to any disclaimer, the term of this patent is extended or adjusted under 35 U.S.C. 154(b) by 365 days.

(21) Appl. No.: 16/959,168

(22) PCT Filed: Dec. 30, 2019

(86) PCT No.: PCT/CN2019/129703
§ 371 (c)(1),
(2) Date: Jun. 30, 2020

(87) PCT Pub. No.: WO2021/000548
PCT Pub. Date: Jan. 7, 2021

(65) Prior Publication Data
US 2021/0408873 A1   Dec. 30, 2021

(30) Foreign Application Priority Data

Jul. 3, 2019   (CN) .......................... 201910592307.8
Jul. 11, 2019  (CN) .......................... 201910623572.8

(51) Int. Cl.
*H02K 11/30*   (2016.01)
*H02K 11/27*   (2016.01)
*H02P 5/00*    (2016.01)
*H05K 7/20*    (2006.01)

(52) U.S. Cl.
CPC ............. *H02K 11/30* (2016.01); *H02K 11/27* (2016.01); *H02P 5/00* (2013.01); *H05K 7/20927* (2013.01)

(58) Field of Classification Search
CPC ......... H02K 11/27; H02K 11/30; H02K 5/225
See application file for complete search history.

(56) References Cited

U.S. PATENT DOCUMENTS 5,567,991 A * 10/1996 Schantz ............... H01H 50/021
                                                        361/776

FOREIGN PATENT DOCUMENTS

| CN | 207994847 U | 10/2018 |
|----|-------------|---------|
| CN | 207995590 U | 10/2018 |
| CN | 208924141 U | 5/2019  |
| CN | 110311595 A | 10/2019 |
| CN | 110311596 A | 10/2019 |
| JP | 11353519 A  | 12/1999 |

* cited by examiner

*Primary Examiner* — Dang D Le
(74) *Attorney, Agent, or Firm* — Craft Chu PLLC; Andrew W. Chu

(57) ABSTRACT

The integrated dual-motor controller includes a controller housing, a bus magnetic ring component, an all-in-one module, a control plate, an isolation plate and a drive plate. The bus magnetic ring component, the all-in-one module, the control plate, the isolation plate and the drive plate are all integrated in the controller housing. The integrated dual-motor controller is designed to achieve a high level of integration, and a modular design is used inside to facilitate mounting and reduce the size.

9 Claims, 12 Drawing Sheets

INTEGRATED DUAL-MOTOR CONTROLLER

CROSS-REFERENCE TO RELATED APPLICATIONS

See Application Data Sheet.

STATEMENT REGARDING FEDERALLY SPONSORED RESEARCH OR DEVELOPMENT

Not applicable.

THE NAMES OF PARTIES TO A JOINT RESEARCH AGREEMENT

Not applicable.

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not applicable.

STATEMENT REGARDING PRIOR DISCLOSURES BY THE INVENTOR OR A JOINT INVENTOR

Not applicable.

BACKGROUND OF THE INVENTION

1. Field of the Invention

The present disclosure relates to a dual-motor controller, and in particular, to an integrated dual-motor controller.

2. Description of Related Art Including Information Disclosed Under 37 CFR 1.97 and 37 CFR 1.98

At present, a power module, a capacitor, and a current sensor applied to a controller are all scattered inside the controller, internal connections are complex, and the space utilization of the entire machine is relatively low. In addition, a solution of two power modules is used, the size is relatively large, there are a large number of connection devices, and the structure is complex.

BRIEF SUMMARY OF THE INVENTION

A technical problem to be resolved by the present disclosure is to provide an integrated dual-motor controller for the deficiency in the prior art.

A technical solution for resolving the foregoing technical problem of the present disclosure is as follows. An integrated dual-motor controller includes a controller housing, a bus magnetic ring component, an all-in-one module, a control plate, an isolation plate and a drive plate, wherein the bus magnetic ring component, the all-in-one module, the control plate, the isolation plate, and the drive plate are all integrated in the controller housing.

Beneficial effects of the present disclosure are as follows. The integrated dual-motor controller is designed to achieve a high level of integration, and a modular design is used inside to facilitate mounting and reduce the size.

Based on the foregoing technical solution, the following improvements may further be made to the present disclosure.

Further, the bus magnetic ring component is located on an end side of the all-in-one module, the drive plate is fixed above the all-in-one module, the control plate is provided in parallel above the drive plate, the control plate and the drive plate are mounted through insertion by an adaptation plate with the isolation plate provided therebetween.

The beneficial effects of adopting the foregoing further solution are as follows. The devices such as the two power module units, the boost module, the water-cooling plate, the capacitor, the boost inductors, and the three-phase current sensor of the dual-motor controller are integrally packaged, so that appropriate use of space is facilitated, and the space utilization and the level of integration are improved, thereby greatly reducing a packaging volume of the modules.

Further, the all-in-one module includes a water-cooling plate, a power module, a capacitor, a boost inductor group, a three-phase current sensor, a relay, a potting box, a boost module, an electric motor module and a power generator module;

the capacitor, the boost inductor group and the relay are arranged on one side of the water-cooling plate, and the power module, the three-phase current sensor, the boost module, the electric motor module and the power generator module are fixed on the other side thereof; and the potting box is fixedly connected to the water-cooling plate to form a glue potting cavity, and the capacitor and the boost inductor group are potted and fixed in the glue potting cavity.

The beneficial effects of adopting the foregoing further solution are as follows. The controller is integrated with a multiplexing charger module, the electric motor module, the power generator module, and the boost module, so that the level of integration is high.

Further, the power module includes the boost module, a power generator controller unit and an electric motor controller unit, and wafer components of the units of the power module are soldered to the water-cooling plate; and the boost inductor group includes a first boost inductor, a second boost inductor and a third boost inductor.

The beneficial effects of adopting the foregoing further solution are as follows. A current common copper-based plate structure is omitted for the modules, and the modules are directly soldered on the water-cooling plate, so that heat dissipation resistance is greatly reduced, and the heat dissipation efficiency is improved.

Further, the modules of the all-in-one module are connected by a copper bus bar assembly, and the copper bus bar assembly includes a positive pole copper bus bar, a negative pole copper bus bar, a first adaptation copper bus bar, a second adaptation copper bus bar, a third adaptation copper bus bar, a fourth adaptation copper bus bar, a fifth adaptation copper bus bar, a first inductance output copper bus bar, a second inductance output copper bus bar and a third inductance output copper bus bar.

The beneficial effects of adopting the foregoing further solution are as follows. The control plate and the adaptation plate are integrated, the control plate and the drive plate are connected in an insertion manner, and a low-voltage plug is fixed on the control plate in a soldering manner, thereby reducing connections of wire harnesses.

Further, a positive pole input terminal is connected to two input poles of the relay by the positive pole copper bus bar; the positive pole copper bus bar is further connected to the capacitor by the first adaptation copper bus bar; the positive pole copper bus bar is connected and divided into three paths for parallel connection, wherein two paths are, via an output pole of the relay, respectively connected to input poles of the first boost inductor and the second boost inductor by the second adaptation copper bus bar and the third adaptation copper bus bar, and the other path is, directly via the input pole of the relay, directly connected to an input pole of the third boost inductor by the fourth adaptation copper bus bar; and the negative pole copper bus bar is connected to the capacitor, and an output pole of the boost inductor group is connected to three-phase electrodes of the boost module of the power module by the fifth adaptation copper bus bar.

The beneficial effects of adopting the foregoing further solution are as follows. The capacitor, the boost inductors, the three-phase current sensor and the entire power module are integrally packaged on the water-cooling plate. The relay for switching between a boost function and a charger function may also be integrally mounted on the water-cooling plate. Signal lead pins of the three-phase current sensor and pins of the power module are both directly soldered on the drive plate, so that internal connections are reduced, components are fixed, the assembly is simplified, the structure is compact, and costs are reduced.

Further, an electrode of the capacitor is connected to an electrode of the power module in a soldering manner or by a screw.

The beneficial effects of adopting the foregoing further solution are as follows. A current common copper-based plate structure is omitted for the modules, and the modules are directly soldered on the water-cooling plate, so that heat dissipation resistance is greatly reduced, and the heat dissipation efficiency is improved.

Further, the potting box is fixedly connected to the water-cooling plate by a screw to form the glue potting cavity, and a sealing structure is formed around the cavity; and the three-phase current sensor is sleeved over three-phase-side electrodes of the power module and is fixed on the water-cooling plate, and the relay is fixed on the water-cooling plate at an outer side of the potting box by a screw.

The beneficial effects of adopting the foregoing further solution are as follows. A modular design is used to facilitate mounting and maintenance.

Further, the controller housing includes three layers, among which the upper layer is a controller upper cover, the middle layer is a controller casing, and the lower layer is a controller lower cover; and power generator three-phase output terminals, electric motor three-phase output terminals, a positive pole input terminal, a low-voltage plug, a multiplexing charger socket, and a water inlet nozzle and a water outlet nozzle connected to the water-cooling plate are provided on the controller casing.

The beneficial effects of adopting the foregoing further solution are as follows. A layered design is used, so that the space utilization is improved, and the power density of the entire machine is improved.

Further, the adaptation plate and the control plate are integrated into one plate, and the low-voltage plug is further soldered on the control plate.

The beneficial effects of adopting the foregoing further solution are as follows. The adaptation plate is directly soldered on the water-cooling plate, so that heat dissipation resistance is greatly reduced, and the heat dissipation efficiency is improved.

The advantages of additional aspects of the present disclosure are partially provided in the following description and partially become obvious from the following description or understood through the practice of the present disclosure.

Reference signs represent the following components: 1—controller housing; 2—bus magnetic ring component; 3—all-in-one module; 4—control plate; 5—isolation plate; 6—drive plate; 7—adaptation plate; 8—water-cooling plate; 9—power module; 10—capacitor; 11—boost inductor group; 12—three-phase current sensor; 13—relay; 14—potting box; 15—boost module; 16—electric motor module; 17—power generator module; 18—transformer unit; 19—power generator controller unit; 20—electric motor controller unit; 21—first boost inductor; 22—second boost inductor; 23—third boost inductor; 24—positive pole copper bus bar; 25—negative pole copper bus bar; 26—first adaptation copper bus bar; 27—second adaptation copper bus bar; 28—third adaptation copper bus bar; 29—fourth adaptation copper bus bar; 30—fifth adaptation copper bus bar; 31—first inductance output copper bus bar; 32—second inductance output copper bus bar; 33—third inductance output copper bus bar; 34—positive pole input terminal; 35—controller upper cover; 36—controller casing; 37—controller lower cover; 38—power generator three-phase output terminal; 39—electric motor three-phase output terminal; 40—low-voltage plug; 41—multiplexing charger socket; 42—water inlet nozzle; 43—water outlet nozzle; and 44—copper bus bar assembly.

DETAILED DESCRIPTION OF THE INVENTION

The principle and features of the present disclosure are described below with reference to the accompanying drawings. The examples are merely used to describe the present disclosure but are not used to limit the scope of the present disclosure.

Figure 1:
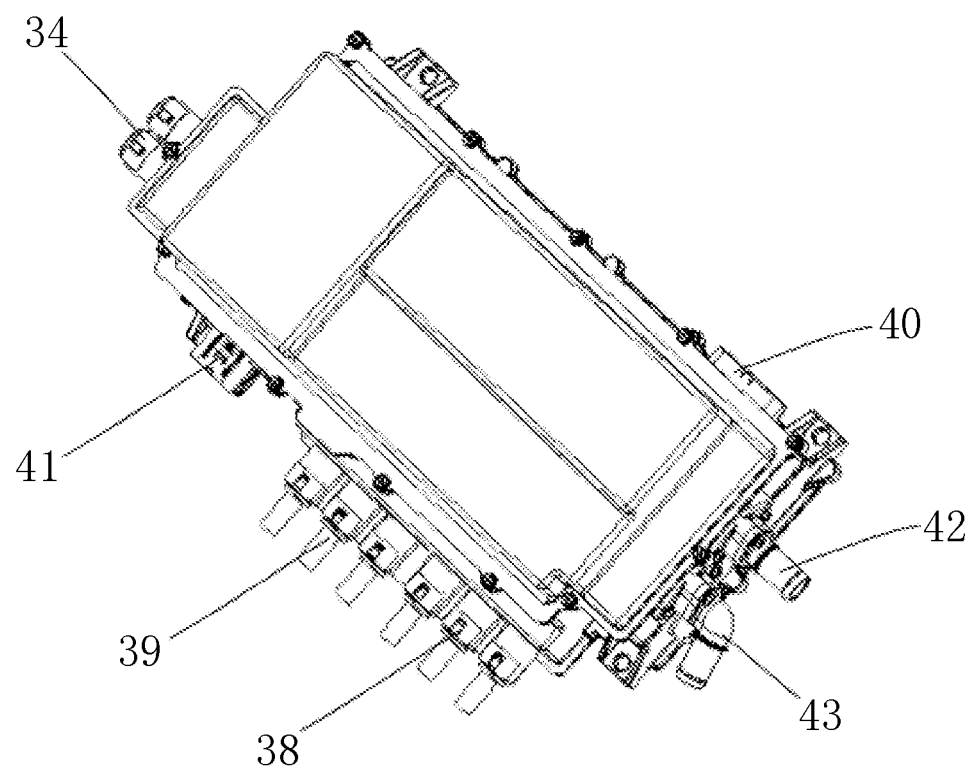
FIG. 1 is a schematic structural diagram 1 of an integrated dual-motor controller according to an embodiment of the present disclosure.
Figure 2:
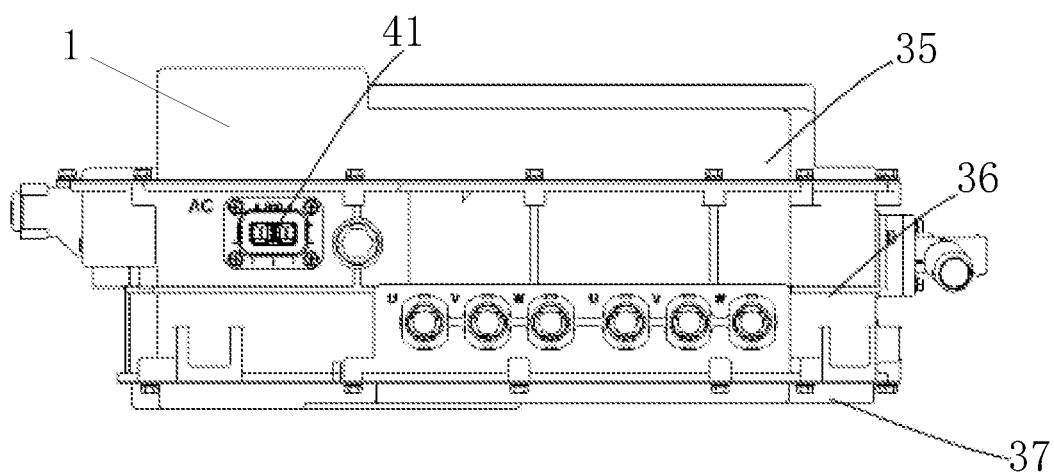
FIG. 2 is a schematic structural diagram 2 of an integrated dual-motor controller according to an embodiment of the present disclosure.
Figure 3:
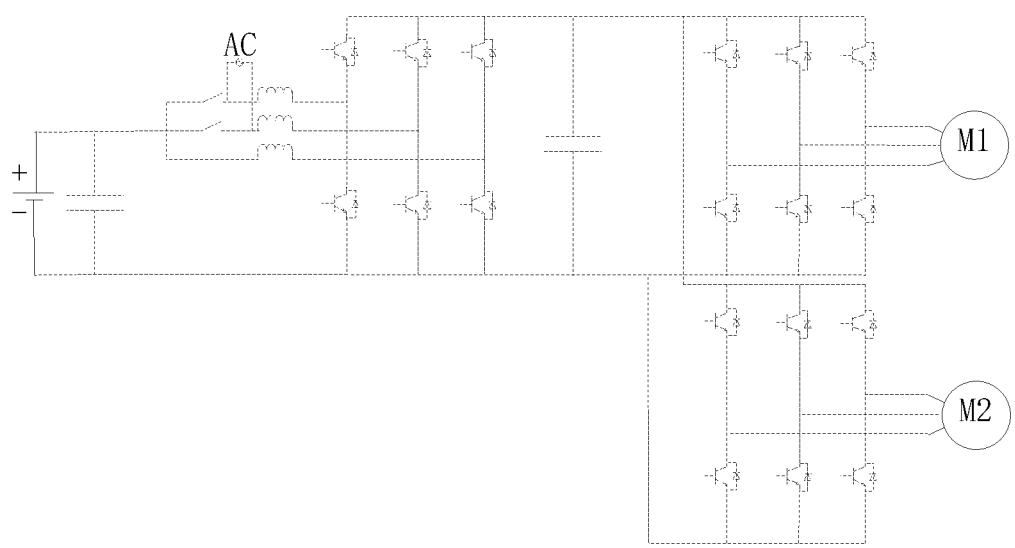
FIG. 3 is a topology view 1 of electrical connection of an integrated dual-motor controller according to an embodiment of the present disclosure.
Figure 4:
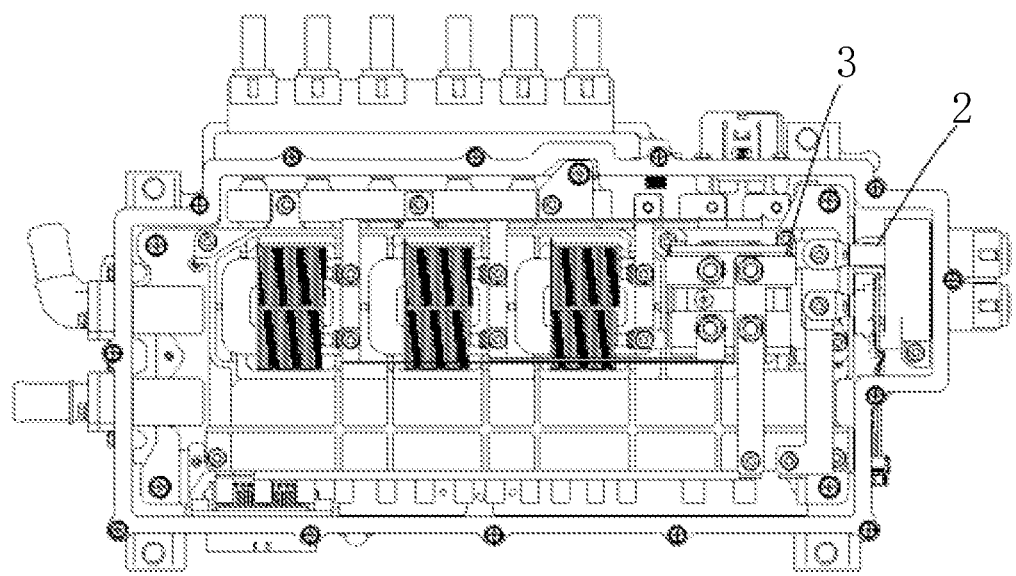
FIG. 4 is a schematic structural diagram 3 of an integrated dual-motor controller according to an embodiment of the present disclosure.
Figure 5:
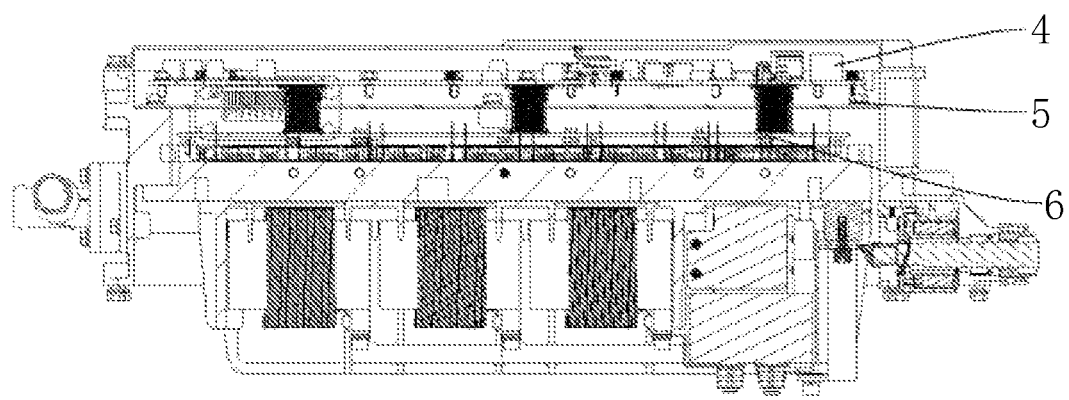
FIG. 5 is a schematic structural diagram 4 of an integrated dual-motor controller according to an embodiment of the present disclosure.
Figure 6:
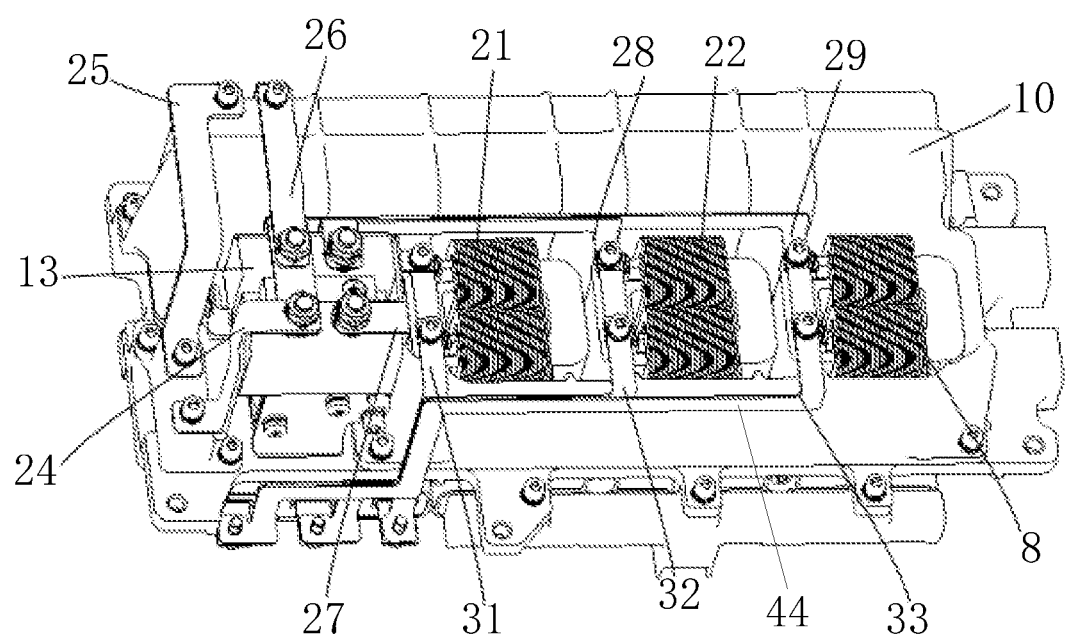
FIG. 6 is a schematic structural diagram 5 of an integrated dual-motor controller according to an embodiment of the present disclosure.
Figure 7:
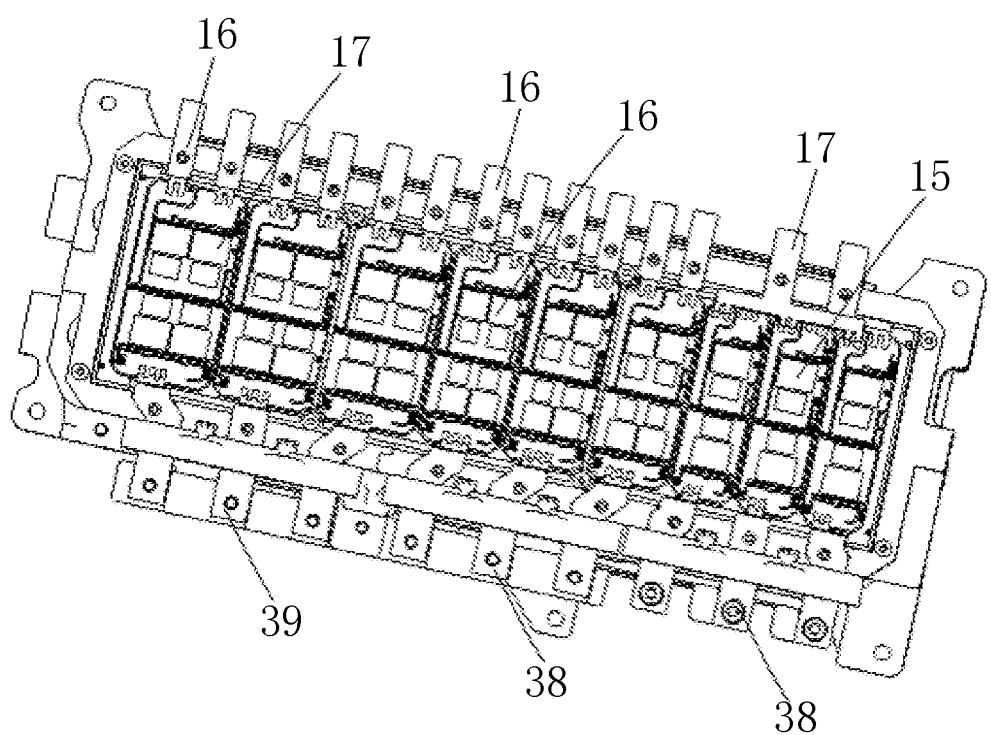
FIG. 7 is a schematic structural diagram 6 of an integrated dual-motor controller according to an embodiment of the present disclosure.
Figure 8:
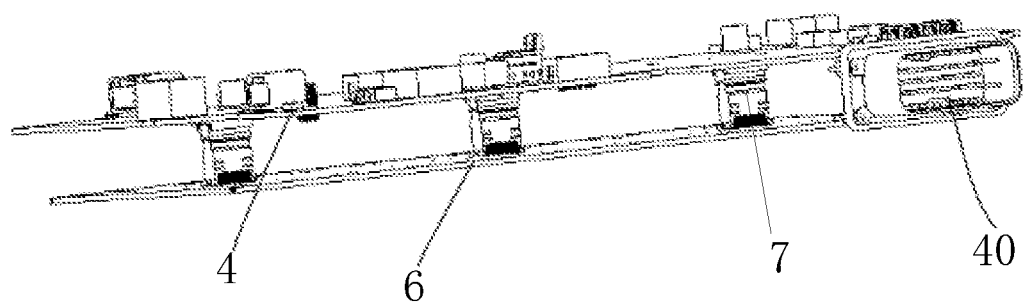
FIG. 8 is a schematic structural diagram 7 of an integrated dual-motor controller according to an embodiment of the present disclosure.
Figure 9:
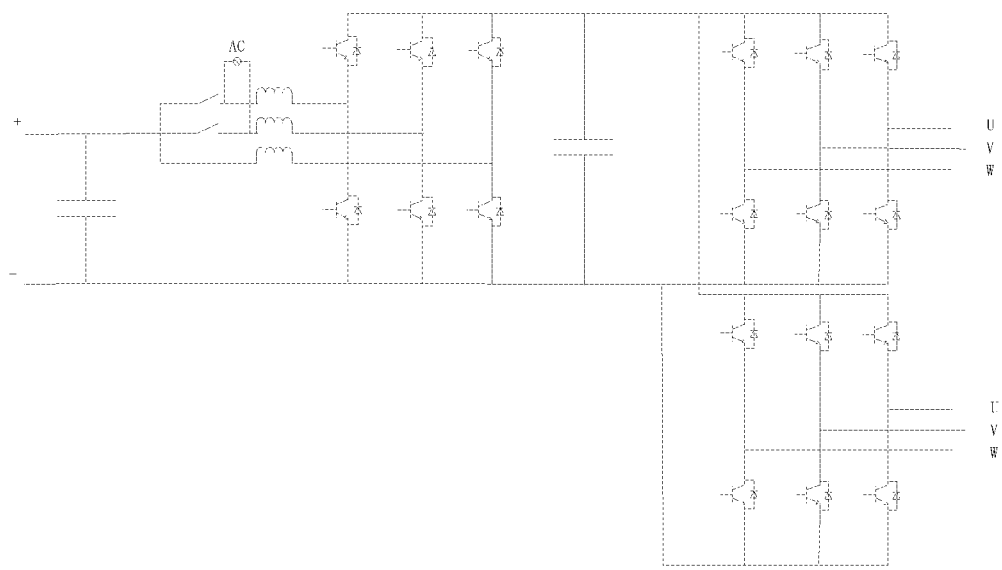
FIG. 9 is a topology view 2 of electrical connection of an integrated dual-motor controller according to an embodiment of the present disclosure.
Figure 10:
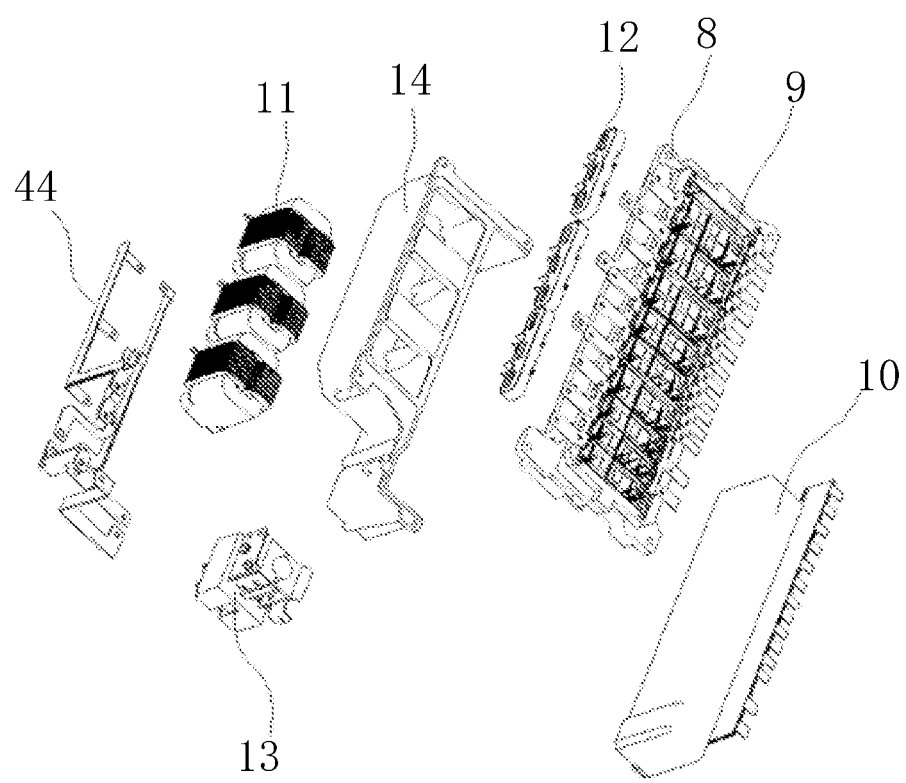
FIG. 10 is a schematic structural diagram 8 of an integrated dual-motor controller according to an embodiment of the present disclosure.
Figure 11:
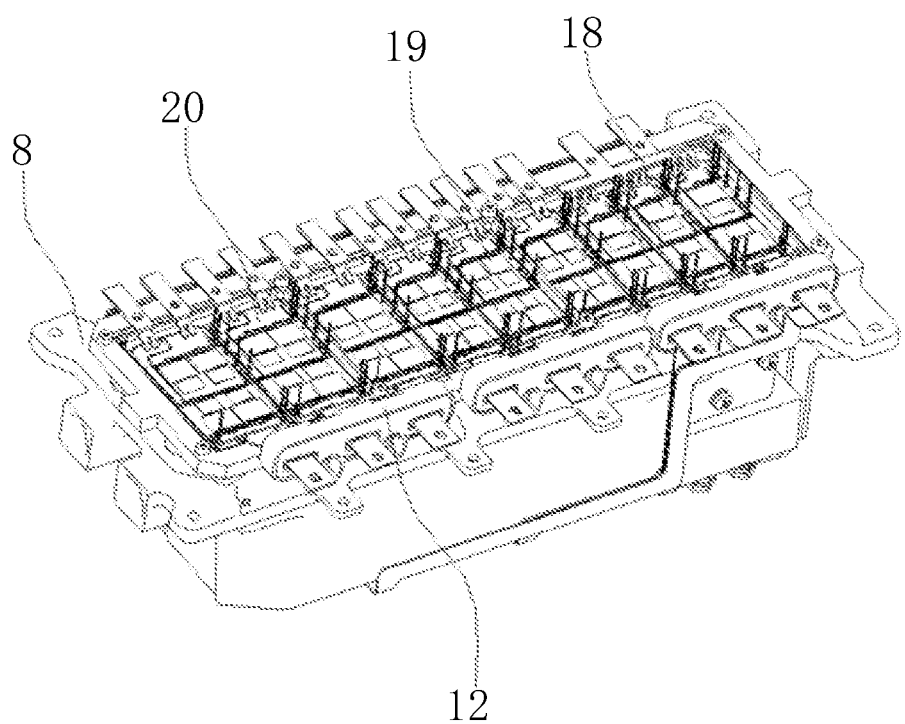
FIG. 11 is a schematic structural diagram 9 of an integrated dual-motor controller according to an embodiment of the present disclosure.
Figure 12:
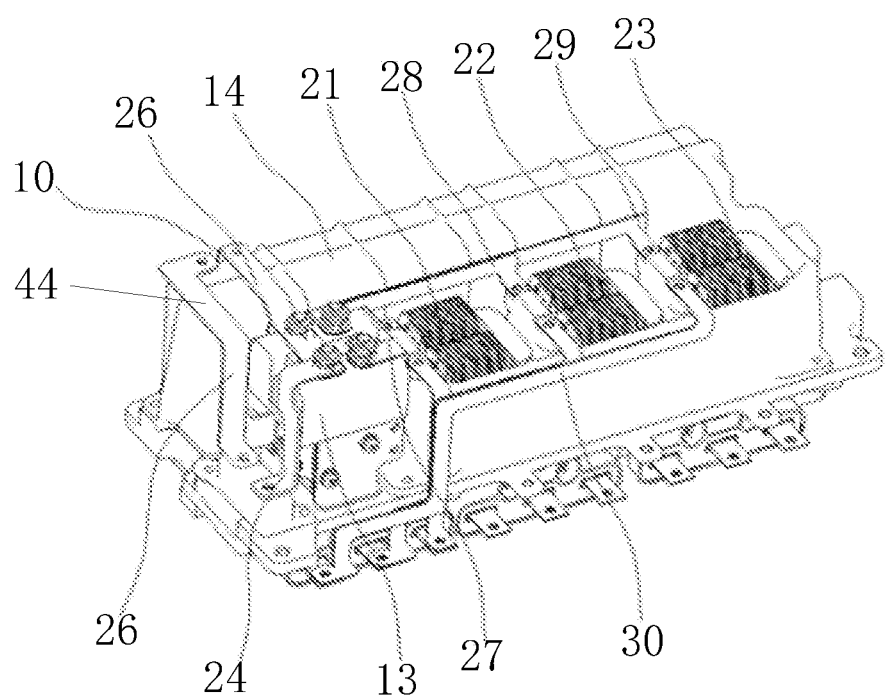
FIG. 12 is a schematic structural diagram 10 of an integrated dual-motor controller according to an embodiment of the present disclosure.

As shown in FIG. 1 to FIG. 12, FIG. 1 is a schematic structural diagram 1 of an integrated dual-motor controller according to an embodiment of the present disclosure. FIG. 2 is a schematic structural diagram 2 of an integrated dual-motor controller according to an embodiment of the present disclosure. FIG. 3 is a topology view 1 of electrical connection of an integrated dual-motor controller according to an embodiment of the present disclosure. FIG. 4 is a schematic structural diagram 3 of an integrated dual-motor controller according to an embodiment of the present disclosure. FIG. 5 is a schematic structural diagram 4 of an integrated dual-motor controller according to an embodiment of the present disclosure. FIG. 6 is a schematic structural diagram 5 of an integrated dual-motor controller according to an embodiment of the present disclosure. FIG. 7 is a schematic structural diagram 6 of an integrated dual-motor controller according to an embodiment of the present disclosure. FIG. 8 is a schematic structural diagram 7 of an integrated dual-motor controller according to an embodiment of the present disclosure. FIG. 9 is a topology view 2 of electrical connection of an integrated dual-motor controller according to an embodiment of the present disclosure. FIG. 10 is a schematic structural diagram 8 of an integrated dual-motor controller according to an embodiment of the present disclosure. FIG. 11 is a schematic structural diagram 9 of an integrated dual-motor controller according to an embodiment of the present disclosure. FIG. 12 is a schematic structural diagram 10 of an integrated dual-motor controller according to an embodiment of the present disclosure.

An embodiment of the present disclosure provides an integrated dual-motor controller that includes a controller housing 1, a bus magnetic ring component 2, an all-in-one module 3, a control plate 4, an isolation plate 5 and a drive plate 6. The bus magnetic ring component 2, the all-in-one module 3, the control plate 4, the isolation plate 5, and the drive plate 6 are all integrated in the controller housing 1.

Beneficial effects of the present disclosure are as follows. The integrated dual-motor controller is designed to achieve a high level of integration, and a modular design is used inside to facilitate mounting and reduce the size.

Specifically, as shown in FIG. 1 and FIG. 2, the controller of the present disclosure includes the controller housing 1 and modules inside the controller. The controller housing 1 includes three layers, among which the upper layer is a controller upper cover 35, the middle layer is a controller casing 36, and the lower layer is a controller lower cover 37. Power generator three-phase output terminals 38, electric motor three-phase output terminals 39, a positive pole input terminal 34, a low-voltage plug 40, a multiplexing charger socket 41, and a water inlet nozzle 42 and a water outlet nozzle 43 connected to a water-cooling plate 8 are provided on the controller casing 36.

As shown in FIG. 4 and FIG. 5, the controller includes the bus magnetic ring component 2, the all-in-one module 3, the control plate 4, the isolation plate 5 and the drive plate 6. The bus magnetic ring component 2 is located on an end side of the all-in-one module 3. The drive plate 6 is fixed above the all-in-one module 3. The control plate 4 is provided in parallel above the drive plate 6. The control plate 4 and the drive plate 6 are mounted through insertion by an adaptation plate 7 with the isolation plate 5 provided therebetween. As shown in FIG. 8, the adaptation plate 7 and the control plate 4 are integrated into one plate, and the low-voltage plug 40 is further soldered on the control plate 4.

As shown in FIG. 6 and FIG. 7, the all-in-one module 2 includes the water-cooling plate 8, a capacitor 10, a boost inductor group 11, a relay 13, a boost module 15, an electric motor module 16 and a power generator module 17. The capacitor 10, the boost inductor group 11 and the relay 13 are arranged on one side of the water-cooling plate 8. The boost module 15, the electric motor module 16 and the power generator module 17 are fixed on the other side thereof. The boost inductor group 11 includes a first boost inductor 21, a second boost inductor 22 and a third boost inductor 23.

Further, the modules of the all-in-one module 3 are connected by a copper bus bar assembly 44. The copper bus bar assembly 44 includes a positive pole copper bus bar 24, a negative pole copper bus bar 25, a first adaptation copper bus bar 26, a second adaptation copper bus bar 27, a third adaptation copper bus bar 28, a fourth adaptation copper bus bar 29, a first inductance output copper bus bar 31, a second inductance output copper bus bar 32 and a third inductance output copper bus bar 33.

Referring to FIG. 3, the positive pole input terminal 34 is connected to two input poles of the relay 13 by the positive pole copper bus bar 24. The positive pole copper bus bar 24 is further connected to the capacitor 10 by the first adaptation copper bus bar 26. Two output poles of the relay 13 are respectively connected to the first boost inductor 21 and the second boost inductor 22 by the second adaptation copper bus bar 27 and the third adaptation copper bus bar 28. The positive pole copper bus bar 24 is further directly connected to the third boost inductor 23 by the fourth adaptation copper bus bar 29. The negative pole copper bus bar 25 is connected to the capacitor 10.

The first boost inductor 21, the second boost inductor 22, and the third boost inductor 23 are respectively connected to three-phase input terminals of the boost module 15 by the first inductance output copper bus bar 31, the second inductance output copper bus bar 32, and the third inductance output copper bus bar 33. From a boost input copper bus bar through the boost module 15, one path is connected to the capacitor 10, and one path is connected to the electric motor module 16 and the power generator module 17. The electric motor module 16 and the power generator module 17 are respectively connected to the electric motor three-phase output terminals 39 and the power generator three-phase output terminals 38.

When the relay 13 is open, the positive electrode of the multiplexing charger socket is connected to the positive pole copper bus bar 24, and the negative electrode thereof is connected to the negative pole copper bus bar 25 for a multiplexing charger to perform charging.

As shown in FIG. 10, the controller of the present disclosure includes the water-cooling plate 8, a power module 9, the capacitor 10, the boost inductor group 11, a three-phase current sensor 12, the relay 13, a potting box 14 and the copper bus bar assembly 44. The power module 9 and the three-phase current sensor 12 are fixed on one side of the water-cooling plate 8, and the capacitor 10, the boost inductor group 11, and the relay 13 are arranged on the other side thereof. The potting box 14 is fixedly connected to the water-cooling plate 8 to form a glue potting cavity. The capacitor 10 and the boost inductor group 11 are potted and fixed in the glue potting cavity.

As shown in FIG. 11, the power module 9 includes a boost transformer unit 18, a power generator controller unit 19 and an electric motor controller unit 20, and wafer components of the units of the power module 9 are soldered to the water-cooling plate 8. Further, an electrode of the capacitor 10 is connected to an electrode of the power module 9 in a soldering manner or by a screw. The potting box 14 is fixedly connected to the water-cooling plate 8 by a screw to form the glue potting cavity, and a sealing structure is formed around the cavity, so that it is ensured that a potted glue at the capacitor 10 and the boost inductor group 11 does not leak. The three-phase current sensor 12 is sleeved over three-phase-side electrodes of the power module 9 and is fixed on the water-cooling plate 8. The relay 13 is fixed on the water-cooling plate 8 at an outer side of the potting box 14 by a screw.

As shown in FIG. 12, the copper bus bar assembly 44 is used to implement electrical connection inside the integrated packaging structure. The boost inductor group 11 includes the first boost inductor 21, the second boost inductor 22 and the third boost inductor 23.

Referring to FIG. 10 to FIG. 12, the copper bus bar assembly 11 includes the positive pole copper bus bar 24, the negative pole copper bus bar 25, and the first adaptation copper bus bar 26 to a fifth adaptation copper bus bar 30. The positive pole copper bus bar 24 is directly connected to an input pole of the relay 13 and is further connected to the positive electrode of the capacitor 10 by the first adaptation copper bus bar 26. The negative pole copper bus bar 25 is connected to the negative electrode of the capacitor 10. The positive pole copper bus bar 24 is connected and divided into three paths for parallel connection, wherein two paths are, via an output pole of the relay 13, respectively connected to input poles of the first boost inductor 21 and the second boost inductor 22 by the second adaptation copper bus bar 27 and the third adaptation copper bus bar 28, and the other path is, directly via the input pole of the relay 13, directly connected to an input pole of the third boost inductor 23 by the fourth adaptation copper bus bar 29. The output pole of the boost inductor group 11 is connected to three-phase electrodes of the boost transformer unit 18 of the power module 9 by the fifth adaptation copper bus bar 30.

In the solution of the present disclosure, the devices such as the two power module units, the boost transformer unit 18, the water-cooling plate 8, the capacitor 10, the boost inductor group 11, and the three-phase current sensor 12 of the dual-motor controller are integrally packaged, so that appropriate use of space is facilitated, the volume of the entire machine can be effectively reduced, and the space utilization and the level of integration are improved, thereby greatly reducing a packaging volume of the modules.

Further, the bus magnetic ring component 2 is located on an end side of the all-in-one module 3, the drive plate 6 is fixed above the all-in-one module 3, the control plate 4 is provided in parallel above the drive plate 6, the control plate 4 and the drive plate 6 are mounted through insertion by the adaptation plate 7 with the isolation plate 5 provided therebetween.

The beneficial effects of adopting the foregoing further solution are as follows. The devices such as the two power module units, the boost module, the water-cooling plate, the capacitor, the boost inductors, and the three-phase current sensor of the dual-motor controller are integrally packaged, so that appropriate use of space is facilitated, and the space utilization and the level of integration are improved, thereby greatly reducing a packaging volume of the modules.

Further, the all-in-one module 3 includes the water-cooling plate 8, the power module 9, the capacitor 10, the boost inductor group 11, the three-phase current sensor 12, the relay 13, the potting box 14, the boost module 15, the electric motor module 16, and the power generator module 17.

The capacitor 10, the boost inductor group 11, and the relay 13 are arranged on one side of the water-cooling plate 8, and the power module 9, the three-phase current sensor 12, the boost module 15, the electric motor module 16, and the power generator module 17 are fixed on the other side thereof.

The potting box 14 is fixedly connected to the water-cooling plate 8 to form the glue potting cavity, and the capacitor 10 and the boost inductor group 11 are potted and fixed in the glue potting cavity.

The beneficial effects of adopting the foregoing further solution are as follows. The controller is integrated with a multiplexing charger module, the electric motor module, the power generator module, and the boost module, so that the level of integration is high.

Further, the power module 9 includes the boost module 18, the power generator controller unit 19 and the electric motor controller unit 20, and wafer components of the units of the power module 9 are soldered to the water-cooling plate 8.

The boost inductor group 11 includes the first boost inductor 21, the second boost inductor 22 and the third boost inductor 23.

The beneficial effects of adopting the foregoing further solution are as follows. A current common copper-based plate structure is omitted for the modules, and the modules are directly soldered on the water-cooling plate, so that heat dissipation resistance is greatly reduced, and the heat dissipation efficiency is improved.

Further, the modules of the all-in-one module 3 are connected by the copper bus bar assembly 44. The copper bus bar assembly 44 includes the positive pole copper bus bar 24, the negative pole copper bus bar 25, the first adaptation copper bus bar 26, the second adaptation copper bus bar 27, the third adaptation copper bus bar 28, the fourth adaptation copper bus bar 29, and the fifth adaptation copper bus bar 30, the first inductance output copper bus bar 31, the second inductance output copper bus bar 32 and the third inductance output copper bus bar 33.

The beneficial effects of adopting the foregoing further solution are as follows. The control plate and the adaptation plate are integrated, the control plate and the drive plate are connected in an insertion manner, and the low-voltage plug is fixed on the control plate in a soldering manner, thereby reducing connections of wire harnesses.

Further, the positive pole input terminal 34 is connected to two input poles of the relay 13 by the positive pole copper bus bar 24, the positive pole copper bus bar 24 is further connected to the capacitor 10 by the first adaptation copper bus bar 26, and the positive pole copper bus bar 24 is connected and divided into three paths for parallel connection, wherein two paths are, via an output pole of the relay 13, respectively connected to input poles of the first boost inductor 21 and the second boost inductor 22 by the second adaptation copper bus bar 27 and the third adaptation copper bus bar 28, and the other path is, directly via the input pole of the relay 13, directly connected to an input pole of the third boost inductor 23 by the fourth adaptation copper bus bar 29.

The negative pole copper bus bar 25 is connected to the capacitor 10, and an output pole of the boost inductor group 11 is connected to three-phase electrodes of the boost module 15 of the power module 9 by the fifth adaptation copper bus bar 30.

The beneficial effects of adopting the foregoing further solution are as follows. The capacitor, the boost inductors, the three-phase current sensor, and the entire power module are integrally packaged on the water-cooling plate. The relay for switching between a boost function and a charger function may also be integrally mounted on the water-cooling plate. Signal lead pins of the three-phase current sensor and pins of the power module are both directly soldered on the drive plate, so that internal connections are reduced, components are fixed, the assembly is simplified, the structure is compact, and costs are reduced.

Further, an electrode of the capacitor 10 is connected to an electrode of the power module 9 in a soldering manner or by a screw.

The capacitor is a film capacitor.

The beneficial effects of adopting the foregoing further solution are as follows. A current common copper-based plate structure is omitted for the modules, and the modules are directly soldered on the water-cooling plate, so that heat dissipation resistance is greatly reduced, and the heat dissipation efficiency is improved.

Further, the potting box 14 is fixedly connected to the water-cooling plate 8 by a screw to form the glue potting cavity, and a sealing structure is formed around the cavity.

The three-phase current sensor 12 is sleeved over three-phase-side electrodes of the power module 9 and is fixed on the water-cooling plate 8, and the relay 13 is fixed on the water-cooling plate 8 at an outer side of the potting box 14 by a screw.

The beneficial effects of adopting the foregoing further solution are as follows. A modular design is used to facilitate mounting and maintenance.

Further, the controller housing 1 includes three layers. The upper layer is the controller upper cover 35, the middle layer is the controller casing 36, and the lower layer is the controller lower cover 37.

Power generator three-phase output terminals 38, the electric motor three-phase output terminals 39, the positive pole input terminal 34, the low-voltage plug 40, the multiplexing charger socket 41, the water inlet nozzle 42 and the water outlet nozzle 43 connected to the water-cooling plate 8 are provided on the controller casing 36.

The beneficial effects of adopting the foregoing further solution are as follows. A layered design is used, so that the space utilization is improved, and the power density of the entire machine is improved.

Further, the adaptation plate 7 and the control plate 4 are integrated into one plate, and the low-voltage plug is further soldered on the control plate 4.

The beneficial effects of adopting the foregoing further solution are as follows. The adaptation plate is directly soldered on the water-cooling plate, so that heat dissipation resistance is greatly reduced, and the heat dissipation efficiency is improved.

Finally, it should be noted that the foregoing embodiments are merely intended for describing the technical solutions of the present disclosure rather than limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all the technical features thereof, without departing from the scope of the technical solutions of the embodiments of the present disclosure.

We claim:

1. An integrated dual-motor controller, comprising:
    a bus magnetic ring component (2);
    an all-in-one module (3);
    a control plate (4);
    an isolation plate (5);
    a drive plate (6); and
    a controller housing (1), said bus magnetic ring component (2), said all-in-one module (3), said control plate (4), said isolation plate (5), and said drive plate (6) being integrated in said controller housing (1),
    wherein said all-in-one module (3) comprises a water-cooling plate (8), a power module (9), a capacitor (10), a boost inductor group (11), a three-phase current sensor (12), a relay (13), a potting box (14), a boost module (15), an electric motor module (16) and a power generator module (17),
    wherein said capacitor (10), said boost inductor group (11) and said relay (13) are arranged on one side of said water-cooling plate (8),
    wherein said power module (9), said three-phase current sensor (12), said boost module (15), said electric motor module (16) and said power generator module (17) are fixed on an opposite side of said water-cooling plate (8),
    wherein said potting box (14) is fixedly connected to said water-cooling plate (8) so as to form a glue potting cavity, and
    wherein said capacitor (10) and said boost inductor group (11) are potted and fixed in said glue potting cavity.

2. The integrated dual-motor controller according to claim 1, wherein said bus magnetic ring component (2) is located on an end side of said all-in-one module (3),
    wherein said drive plate (6) is fixed above said all-in-one module (3),
    wherein said control plate (4) is provided in parallel above said drive plate (6), and
    wherein said control plate (4) and said drive plate (6) are mounted through insertion by an adaptation plate (7) with said isolation plate (5) provided therebetween.

3. The integrated dual-motor controller according to claim 2, wherein said adaptation plate (7) and said control plate (4) are integrated into one plate, and
    wherein a low-voltage plug (40) is further soldered on said control plate (4).

4. The integrated dual-motor controller according to claim 1, wherein said all-in-one module (3) is comprised of modules connected by a copper bus bar assembly, and
    wherein said copper bus bar assembly comprises a positive pole copper bus bar (24), a negative pole copper bus bar (25), a first adaptation copper bus bar (26), a second adaptation copper bus bar (27), a third adaptation copper bus bar (28), a fourth adaptation copper bus bar (29), a fifth adaptation copper bus bar (30), a first inductance output copper bus bar (31), a second inductance output copper bus bar (32) and a third inductance output copper bus bar (33).

5. The integrated dual-motor controller according to claim 4, wherein said relay (13) is comprised of two input holes connected to a positive pole input terminal (34) by said positive pole copper bus bar (24),
    wherein said positive pole copper bus bar (24) is further connected to said capacitor (10) by the first adaptation copper bus bar (26), wherein said positive pole copper bus bar (24) is connected and divided into three paths for parallel connection, wherein two paths are, via an output pole of the relay (13), respectively connected to input poles of the first boost inductor (21) and a second boost inductor (22) by the second adaptation copper bus bar (27) and the third adaptation copper bus bar (28), and another path is, directly via the input pole of the relay (13), directly connected to an input pole of the third boost inductor (23) by the fourth adaptation copper bus bar (29), wherein said negative pole copper bus bar (25) is connected to said capacitor (10), and wherein an output pole of said boost inductor group (11) is connected to three-phase electrodes of said boost module (15) of said power module (9) by said fifth adaptation copper bus bar (30).

6. The integrated dual-motor controller according to claim 1, wherein said capacitor (10) is comprised of a capacitor electrode, wherein said power module (9) is comprised of a power module electrode connected to said capacitor electrode by at least one of a group consisting of solder and screw.

7. The integrated dual-motor controller according to claim 1, wherein controller housing (1) comprises an upper layer s being comprised of a controller upper cover (35), a middle layer being comprised of a controller casing (36), and a lower layer being comprised of a controller lower cover (37), and wherein said water-cooling plate (8) is connected to a power generator three-phase output terminals (38), electric motor three-phase output terminals (39), a positive pole input terminal (34), a low-voltage plug (40), a multiplexing charger socket (41), and a water inlet nozzle (42) and a water outlet nozzle (43) on said controller casing (36).

8. An integrated dual-motor controller, comprising:
a bus magnetic ring component (2);
an all-in-one module (3);
a control plate (4);
an isolation plate (5);
a drive plate (6); and
a controller housing (1), said bus magnetic ring component (2), said all-in-one module (3), said control plate (4), said isolation plate (5), and said drive plate (6) being integrated in said controller housing (1), wherein said all-in-one module (3) comprises a water-cooling plate (8), a power module (9), a capacitor (10), a boost inductor group (11), a three-phase current sensor (12), a relay (13), a potting box (14), a boost module (15), an electric motor module (16) and a power generator module (17), wherein said capacitor (10), said boost inductor group (11) and said relay (13) are arranged on one side of said water-cooling plate (8), wherein said power module (9), said three-phase current sensor (12), said boost module (15), said electric motor module (16) and said power generator module (17) are fixed on an opposite side of said water-cooling plate (8), wherein said potting box (14) is fixedly connected to said water-cooling plate (8) so as to form a glue potting cavity, wherein said capacitor (10) and said boost inductor group (11) are potted and fixed in said glue potting cavity, wherein said power module (9) is comprised of said boost module (15), a power generator controller unit (19), and an electric motor controller unit (20), and wherein said power generator controller unit (19) has power generator wafer components soldered to said water-cooling plate (8), wherein said electric motor controller unit (20) has electric motor wafer components soldered to said water-cooling plate (8), and wherein said boost inductor group (11) comprises a first boost inductor (21), a second boost inductor (22) and a third boost inductor (23).

9. An integrated dual-motor controller, comprising:
a bus magnetic ring component (2);
an all-in-one module (3);
a control plate (4);
an isolation plate (5);
a drive plate (6); and
a controller housing (1), said bus magnetic ring component (2), said all-in-one module (3), said control plate (4), said isolation plate (5), and said drive plate (6) being integrated in said controller housing (1), wherein said all-in-one module (3) comprises a water-cooling plate (8), a power module (9), a capacitor (10), a boost inductor group (11), a three-phase current sensor (12), a relay (13), a potting box (14), a boost module (15), an electric motor module (16) and a power generator module (17), wherein said capacitor (10), said boost inductor group (11) and said relay (13) are arranged on one side of said water-cooling plate (8), wherein said power module (9), said three-phase current sensor (12), said boost module (15), said electric motor module (16) and said power generator module (17) are fixed on an opposite side of said water-cooling plate (8), wherein said potting box (14) is fixedly connected to said water-cooling plate (8) so as to form a glue potting cavity and a sealing structure around said glue potting cavity, wherein said capacitor (10) and said boost inductor group (11) are potted and fixed in said glue potting cavity, wherein said three-phase current sensor (12) is sleeved over three-phase-side electrodes of the power module (9) and is fixed on said water-cooling plate (8), and wherein said relay (13) is fixed on said water-cooling plate (8) at an outer side of said potting box (14) by a screw.

* * * * *